(12) United States Patent
Feuillet et al.

(10) Patent No.: US 7,906,362 B2
(45) Date of Patent: Mar. 15, 2011

(54) ASSEMBLING TWO SUBSTRATES BY MOLECULAR ADHESION

(75) Inventors: Guy Feuillet, Saint Martin d'uriage (FR); Hubert Moriceau, Saint Egreve (FR); Stephane Pocas, Grenoble (FR); Eric Jalaguier, Saint Martin d'Uriage (FR); Norbert Moussy, Saint Agnes (FR)

(73) Assignee: Commissariat a l'Energie Atomique, Paris (FR)

( * ) Notice: Subject to any disclaimer, the term of this patent is extended or adjusted under 35 U.S.C. 154(b) by 260 days.

(21) Appl. No.: 11/630,283

(22) PCT Filed: Jun. 29, 2005

(86) PCT No.: PCT/FR2005/050522
§ 371 (c)(1),
(2), (4) Date: Nov. 20, 2007

(87) PCT Pub. No.: WO2006/008411
PCT Pub. Date: Jan. 26, 2006

(65) Prior Publication Data
US 2008/0296712 A1    Dec. 4, 2008

(30) Foreign Application Priority Data
Jun. 30, 2004 (FR) .................. 04 51374

(51) Int. Cl.
*H01L 21/00* (2006.01)
*H01L 21/30* (2006.01)
*H01L 21/46* (2006.01)
*H01L 21/31* (2006.01)
*H01L 21/469* (2006.01)

(52) U.S. Cl. ... 438/64; 438/455; 438/777; 257/E21.499; 257/E33.057; 29/830

(58) Field of Classification Search .......... 438/777, 438/64, 455; 257/E21.499, E33.057; 29/830
See application file for complete search history.

(56) References Cited

U.S. PATENT DOCUMENTS
5,374,564 A   12/1994   Bruel
(Continued)

FOREIGN PATENT DOCUMENTS
FR   2 783 969   3/2000
(Continued)

OTHER PUBLICATIONS

Q.-Y. Tong, et al., "Semiconductor Wafer Bonding: Science and Technology", John Wiley & Sons, Inc., XP 008042464, pp. 215-219, 1999.

(Continued)

*Primary Examiner* — David S Blum
(74) *Attorney, Agent, or Firm* — Oblon, Spivak, McClelland, Maier & Neustadt, L.L.P.

(57) ABSTRACT

An assembly method to enable local electrical bonds between zones located on a face of a first substrate and corresponding zones located on a face of a second substrate, the faces being located facing each other, at least one of the substrates having a surface topography. The method forms an intermediate layer including at least one burial layer on the face of the substrate or substrates having a surface topography to make it (them) compatible with molecular bonding of the faces of substrates to each other from a topographic point of view, resistivity and/or thickness of the intermediate layer being chosen to enable the local electrical bonds, brings the two faces into contact, the substrates positioned to create electrical bonds between areas on the first substrate and corresponding areas on the second substrate, and bonds the faces by molecular bonding.

35 Claims, 6 Drawing Sheets

U.S. PATENT DOCUMENTS

| | | | | |
|---|---|---|---|---|
| 5,880,010 A | * | 3/1999 | Davidson | 438/455 |
| 6,097,096 A | * | 8/2000 | Gardner et al. | 257/777 |
| 6,274,892 B1 | * | 8/2001 | Kub et al. | 257/131 |
| 6,340,812 B1 | | 1/2002 | Izumi et al. | |
| 6,465,892 B1 | * | 10/2002 | Suga | 257/777 |
| 6,809,008 B1 | * | 10/2004 | Holm et al. | 438/455 |
| 6,809,358 B2 | * | 10/2004 | Hsieh et al. | 257/291 |
| 6,902,987 B1 | * | 6/2005 | Tong et al. | 438/455 |
| 7,208,392 B1 | * | 4/2007 | Jaussaud et al. | 438/455 |
| 7,452,745 B2 | * | 11/2008 | Dupont et al. | 438/67 |
| 2002/0164839 A1 | * | 11/2002 | Enquist | 438/119 |
| 2002/0173118 A1 | * | 11/2002 | Dietrich et al. | 438/455 |
| 2003/0129780 A1 | | 7/2003 | Auberton-Herve | 438/46 |
| 2005/0020029 A1 | * | 1/2005 | Danel | 438/455 |
| 2005/0104089 A1 | * | 5/2005 | Engelmann et al. | 257/204 |

FOREIGN PATENT DOCUMENTS

| | | | |
|---|---|---|---|
| FR | 2 816 445 | | 5/2002 |
| FR | WO/03/028101 | * | 4/2003 |
| WO | WO 0118853 A1 | * | 3/2001 |

OTHER PUBLICATIONS

Shiyang Zhu, et al., "Buried Cobalt Silicide Layer Under Thin Silicon Film Fabricated by Wafer Bonding and Hydrogen-Induced Delamination Techniques", Journal of the Electrochemical Society, vol. 146, No. 7, XP 002291929, pp. 2712-2716, 1999.

U.S. Appl. No. 11/630,033, filed Dec. 19, 2006, Moriceau, et al.

* cited by examiner

ASSEMBLING TWO SUBSTRATES BY MOLECULAR ADHESION

PRIORITY STATEMENT

This application is a 371 of PCT/FR05/50522, filed Jun. 29, 2005, and claims priority under 35 U.S.C. §119 to France Patent Application No. 0451374, filed on Jun. 30, 2004, the entire contents of which are incorporated herein by reference.

TECHNICAL DOMAIN

The invention relates to an assembly of two substrates by molecular bonding, at least one of the substrates having a surface topology, this assembly providing a local electrical contact between these two substrates. The invention relates particularly to an assembly of photodetectors on a read circuit.

STATE OF PRIOR ART

Many applications in optoelectronics and microelectronics require that a material with its specific features should be brought into contact with, interfaced with or connected to an addressing or read circuit.

For example, to make a digital image (regardless of the range of wavelength considered: X rays, UV rays, visible or IR radiation), a photon detector should be used with a read circuit. In general, read circuits are composed of pixels with a size that can vary between 10 and 200 µm depending on the target application. Each of these pixels collects the charges that are photo-created plumb to them, and therefore this requires the presence of an individual electrical contact between the photo detector and each pixel.

In other applications, a photo-emitter material can be excited locally, for example by injection of current through an individual electrical contact.

For example, one of the techniques used to make this type of electrical contact consists of using indium balls located directly in openings made in the insulating layer of the read circuit, at conducting pads. This hybridising by indium balls is only possible if the dimensions of the circuit are smaller than a few centimetres, due to thermal expansion problems.

Moreover, the molecular bonding technique has already been envisaged to bring two different crystalline materials (GaAs/Si, InP/Si, CdHgTe/Si . . . ) into intimate contact when the features of the two materials are to be combined. It is known that if the materials have different lattice parameters, it is difficult to bring them into intimate contact by epitaxial growth of one on the other. In this case, heteroepitaxial constraints are relaxed in the growing layer by forming crystalline defects such as dislocations. If so-called molecular bonding methods are used, bonds are rebuilt at the interface between the two different materials, thus assuring continuity between the two crystals. Therefore with molecular bonding techniques, it becomes possible to envisage fully integrated devices in which for example the interfaces must satisfy electrical conduction or photon transparency criteria . . .

However, heterogeneous molecular bonding between different materials is not always possible, due to the lack of chemical affinity between the two materials considered. One way of getting around this problem is to make the bond through two intermediate layers, one deposited on each of the two parts to be brought into contact. The material chosen to make these intermediate layers must be flattened so that chemical bonds can be reconstructed to obtain a perfect bond (see document [1]).

In many applications, an attempt is made to integrate a material with specific properties (for example a photodetector material, a photoemitting material . . . ) or a multilayer structure deposited by epitaxy (of the diode or laser type . . . ), on a read circuit, for example of the CMOS or TFT or CCD type . . . , for which the surface has a certain topography. Molecular bonding involves bringing surfaces that are perfectly flat at atomic scale, without any surface topography, into contact with each other. Thus, it can be seen that it is impossible to achieve direct molecular bonding of the material or the multilayer structure on the read circuit, because it is impossible to bring the entire surfaces considered directly facing each other.

An additional difficulty is to be able to assure good local electrical conduction between the two substrates to be assembled, for example between the photodetector and its collection circuit, while avoiding any significant lateral leak (in other words between pixels). These leaks could create an image with a certain degree of blurring.

PRESENTATION OF THE INVENTION

The purpose of the invention is to provide a method for molecular bonding of two structures, at least one comprising a surface topography, this bonding enabling good quality local vertical electrical conduction between these two structures. For the purposes of this description, the expression "surface topography of a substrate or structure" refers to the relief on the surface of said structure or said substrate.

This purpose is achieved by an assembly method to enable local electrical bonds between zones located on a face of a first substrate and corresponding zones located on a face of a second substrate, said faces being located facing each other, at least one of the substrates having a surface topography, characterised in that the method comprises steps consisting of:

forming an intermediate layer comprising at least one burial layer on the face of the substrate or substrates having a surface topography to make it (them) compatible with molecular bonding of said faces of substrates to each other from a topographic point of view, the resistivity and/or thickness of the intermediate layer being chosen to enable said local electrical bonds, bringing the two faces into contact, the substrates being positioned so as to create electrical bonds between zones located on the first substrate and the corresponding zones located on the second substrate, bonding the faces of the first and second substrates by molecular bonding.

For example, the thickness of the intermediate layer is determined such that, depending on the distance separating the zones located on the first substrate and the corresponding zones located on the second substrate, the distance laterally separating the different zones between each other and the resistivity of this intermediate layer, said local electrical bonds could be obtained excluding any other electrical bond.

A burial layer refers to a layer that covers the topography or surface relief of the face of the substrate on which it is formed to make this surface compatible with subsequent molecular bonding.

If only one substrate comprises a surface topography, the intermediate layer will be deposited on the face of this substrate. On the other hand, if the two substrates have a surface topography, the first and second substrates will each comprise an intermediate layer with at least one burial layer arranged on the face having a surface topography. In this case, it is important to take account of the thickness and/or the resistivity of each of the intermediate layers so as to be able to obtain the required local electrical bonds.

Note that << bringing the two faces into contact>> means creating a contact between the faces of substrates that may or may not comprise an intermediate layer, or as we will see later, a bond layer. For example, the face of the second substrate can be brought into contact with the face of the first substrate comprising an intermediate layer: therefore the intermediate layer will finally be directly in contact with the face of the second substrate.

Note that for the purposes of this description, a face or surface is not necessarily made of a single material, it may consist of several materials.

Advantageously, the burial layer may make it possible to flatten the face of the first substrate.

Advantageously, the intermediate layer further comprises a bond layer formed on the burial layer, said bond layer improving molecular bonding between the faces of the first and second substrates.

According to one variant, if a single substrate has a surface topography, the other substrate that does not have a surface topography comprises a bond layer that improves molecular bonding between the faces of the first and second substrates, this bond layer not disturbing the local electrical bonds made possible by the intermediate layer.

This deposition of a bond layer is useful in the case in which there is a bad affinity between the burial layer of the first substrate and the second substrate or the burial layer of the second substrate.

This bond layer of the second substrate must be taken into account when the thickness and/or resistivity of the intermediate layer of the first substrate has to be determined. Thus, to simplify matters, it can be considered that it will eventually form part of the intermediate layer and therefore that it has to be taken into account to optimise the choice of resistivity and/or thickness of the intermediate layer to give preference to vertical conduction rather than lateral conduction.

Advantageously, before the step in which the faces are brought into contact, the assembly method further includes a step for the treatment of the contact faces of the first and/or second substrate to improve bonding.

According to one particular embodiment, the method further includes, before the step in which an intermediate layer is formed, a step to form an electrically conducting layer on at least one of the zones located on the face of the first substrate and/or on at least one of the corresponding zones located on a face of the second substrate, the said electrically conducting layer being capable of reacting with all or part of the burial layer to form a conducting alloy zone close to the interface.

Advantageously, the electrically conducting layer also reacts with the bond layer of the intermediate layer to form a conducting alloy participating in the alloy zone.

Advantageously, the electrically conducting layer reacts with at least all or part of the surface zone of the substrate facing the substrate on which it was formed to form a conducting alloy participating in the alloy zone. Thus, the alloy zone extends on each side of the bonding interface.

Advantageously, the alloy is formed by heat treatment of the assembly.

Advantageously, the heat treatment of the assembly takes place after the molecular bonding step.

Advantageously, the heat treatment temperature and time are chosen as a function of the required alloy and the quantity of alloy to be obtained. The affinity between the material in the burial layer, or the material in the burial layer and in the adjacent bond layer, and the material in the electrically conducting material layer to form an alloy determines the temperature to which the assembly must be brought to enable creation of the alloy. This transformation step may either additionally or alternatively include a pressurisation step or an electromigration step known to those skilled in the art to form an alloy.

Advantageously, the electrically conducting layer is made from a metal and/or a conducting alloy.

According to one variant embodiment, the burial layer is polished after it is formed.

Advantageously, the first substrate is a read circuit.

Advantageously, the second substrate is made from a photodetector material or a photoemitting material.

Advantageously, the burial layers of the first and second substrates are made from the same material. The two materials have the same chemical composition.

Advantageously, the burial layer is made from a material chosen from among silicon, germanium, SiC or SiGe.

Advantageously, the bond layer is made of silicon. The material from which the bond layer is made is chosen to be compatible with molecular bonding.

Advantageously, the assembly method further comprises a step to flatten at least one burial layer or bond layer present on a face of the substrate(s), this step being made before the step consisting of bringing the two faces into contact. This flattening step is done using a mechanical or mechanical-chemical type polishing technique. Advantageously, the topography or relief of the surfaces to be brought into contact is flattened, or their surface micro-roughness may be reduced until surfaces with the necessary planeness for making molecular bonding are obtained.

Advantageously, the assembly method further comprises a step to delimit conducting zones in the layer(s) separating the two substrates, said conducting zones being located facing said zones located on the first substrate and said corresponding zones on the second substrate, and reinforcing the local electrical bonds allowed by the intermediate layer(s).

Advantageously, the step to delimit the conducting zones in the layer(s) separating the two substrates is made before the step bringing the faces of the first and second substrates into contact by implantation of this or these layers separating the two substrates. For example, an ionic implantation can be made in this or these layers separating the two substrates.

Advantageously, the step to delimit the conducting zones in the layer(s) separating the two substrates is done after the molecular bonding step of the faces of the first and second substrates by heat treatment of the assembly thus obtained such that the layer(s) separating the two substrates and the zones located on the faces of the first and second substrates form a conducting alloy.

The invention also relates to a method for making a photosensitive detector. This method includes assembly using the method according to the invention for assembly of the bonding face of a first substrate with the bonding face of a second substrate,
  the first substrate comprising electrically conducting zones at least on the surface of its bonding face and comprising an intermediate layer on its bonding face, said intermediate layer comprising a burial layer covering the topography of the face of the first substrate,
  the second substrate comprising, at least on its surface, a detection layer made of a material sensitive to the light to be detected.

Advantageously, the sensitive material detection layer is made from mono-crystalline silicon.

Advantageously, the sensitive material detection layer is doped on the surface. An n or p type doping can be used. p type surface doping may be made by ionic implantation of the bond layer.

Advantageously, the first substrate comprising electrically conducting zones at least on the surface of its bonding face, is a read circuit. For example, it may be a VLSI circuit.

Advantageously, the second substrate is an SOI.

The second substrate may be made from indium oxide doped with tin. The second substrate thus forms a detection circuit for the photosensitive detector. It is transparent to light and is conducting and it makes a collective electrical contact zone over the entire surface of the electrically conducting zones on the first substrate (read circuit).

Advantageously, the second substrate is thinned.

Preferably, the material from which the burial layer is made is also chosen so as to have a gap distance similar to that of the material used for the second substrate, so as to minimise the interface resistance between the burial layer and the bond layer.

Advantageously, the burial layer is made from poly-crystalline, micro-crystalline or amorphous silicon. The burial layer may be made from different types, amorphous, micro-crystalline or poly-crystalline, but the material used must have a minimum number of defects so as to minimise thermal generation of charges. For example, polycrystalline silicon can be used.

According to one variant, the burial layer is flattened and/or thinned before being assembled with the second substrate. Thinning can be used to obtain a burial layer thinner than the bond layer such that the ratio of thicknesses can optimise the spectral response of the bond layer (which acts as a detection circuit). The burial layer is typically between 1 and 2 μm thick.

Advantageously, the assembly is covered with a layer of electrically conducting material transparent to the light to be detected (ITO).

Finally, the invention relates to a photosensitive detector comprising the following stack:
- a first substrate comprising electrically conducting zones at least on the surface of its bonding face,
- a poly-crystalline, micro-crystalline or amorphous silicon burial layer deposited on the bonding face of the first substrate at a sufficient thickness to cover the topography of the bonding face of the first substrate,
- a mono-crystalline silicon detection layer transferred onto the burial layer, and having been doped so as to form a diode in the thickness of the detection layer and the burial layer,
- a contact layer made of an electrically conducting material transparent to the light to be detected.

Advantageously, the detection layer is made locally insulating. This can delimit the pixels. The detection layer is made locally insulating, for example by deep etching or local oxidation.

Finally, the invention relates to a microelectronic structure comprising the following stack:
- a first substrate having, on its bonding face, a surface topography and at least one electrically conducting zone,
- a burial layer deposited on this bonding face of the first substrate with a sufficient thickness to cover the topography of said face of first substrate,
- a second substrate comprising at least one electrically conducting zone on its bonding face vertically in line with the said at least one electrically conducting zone on the first substrate, the second substrate being assembled to the first substrate by molecular bonding through the burial layer.

The burial layer is chosen such that it is compatible with molecular bonding with the second substrate.

The burial layer can also be used to electrically and locally connect said at least one electrically conducting zone of the first and second substrates.

BRIEF DESCRIPTION OF THE FIGURES

The invention will be better understood and other advantages and special features will become clearer after reading the description given below as a non-limitative example accompanied by the appended figures, wherein:

FIGS. 4A-4C show an embodiment where the intermediate layer includes a bond layer 4 formed on the burial layer 1. FIG. 4A is similar to FIG. 1A. FIG. 4B shows bond layer 4 formed on burial layer 1. FIGS. 4C and 4D are similar to FIGS. 1B and 1C.

FIG. 5 shows thinning of a second substrate 3.

FIG. 6 shows a layer of electrically conducting material 14 transparent to light on the assembly.

FIGS. 7A-7B show the second substrate 13 is a doped layer and is covered with a layer of electrically conducting material 14 transparent to light.

FIG. 8 shows the doped layer made locally insulating (see element 15).

Note that the dimensions of the layers and substrates in these figures are not shown to scale.

DETAILED DESCRIPTION OF PARTICULAR EMBODIMENTS

The heart of the invention is based on an original stack consisting of physically bringing the material for which the properties are to be used into contact with a substrate, preferably a read circuit, using a technique based on the principle of molecular bonding. In the most particular case of the application to photodetectors, this method must enable transport of photogenerated charges from the photodetector to the read circuit and lateral insulation between pixels to maintain spatial resolution and the contrast in the image. Several variants of this method may be envisaged to satisfy this operating criterion of the device. We will now present the embodiment of different devices comprising a read circuit (first substrate) and a substrate of a photodetector material (second substrate).

Figure 1A:
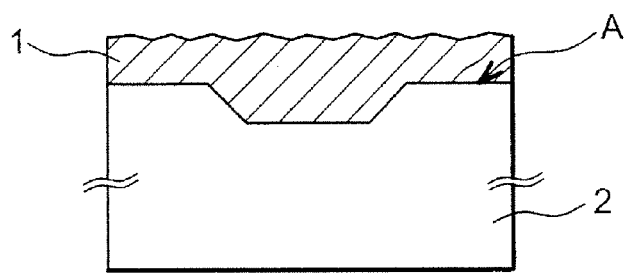
FIGS. 1A to 1C represent steps in an example embodiment of the method according to the invention.

In a first example, a read circuit, for example a CMOS or TFT or CCD circuit, is bonded with a substrate made of a photodetector material. The first step is to deposit a burial layer of a first material 1 onto the face A of the read circuit 2 that comprises a topography (FIG. 1A). The burial layer of the first material 1 is deposited to be sufficiently thick to bury the surface topography of the read circuit 2 and to later <<flatten>> the surface of the circuit thus <<encapsulated>>. This first material is chosen such that it can be used to make the future molecular bonding with the second substrate. The next step is possibly to also deposit a layer 4 of the second material on the substrate 3 made of a protodetector material that is to be connected to the read circuit 2. This second material may be identical to the first material. This layer 4 may be useful if the substrate 3 in question has a surface with a marked topography. This layer 4 of second material may also be used for example to bury any surface roughnesses on the substrate 3. Similarly, this layer 4 is useful if there is a lack of chemical affinity between the substrate 3 and the first substrate 2 supporting the burial layer of the first material 1. The layer 4 then acts as a bond layer to obtain better molecular bonding between the two substrates.

Note that the burial layer deposited on the relief of the substrate(s) and that is also used for bonding is sufficiently thick to bury said surface relief and to subsequently <<flatten>> the surface of the substrates thus <<encapsulated>>.

The material used to cover the surface of the substrates may be a material for which flattening techniques (to <<bury>> the topography of the read circuit) and molecular bonding techniques are controlled; thus, polycrystalline or amorphous silicon can be used. Other materials such as germanium could be used. The choice of the material to be used is also made taking account of constraints to be satisfied to assure a connection of the type required between the two substrates. For example, when bonding a protodetector material with a read circuit, it may be required that their interface should be <<transparent>> to electrons.

Figure 1B:
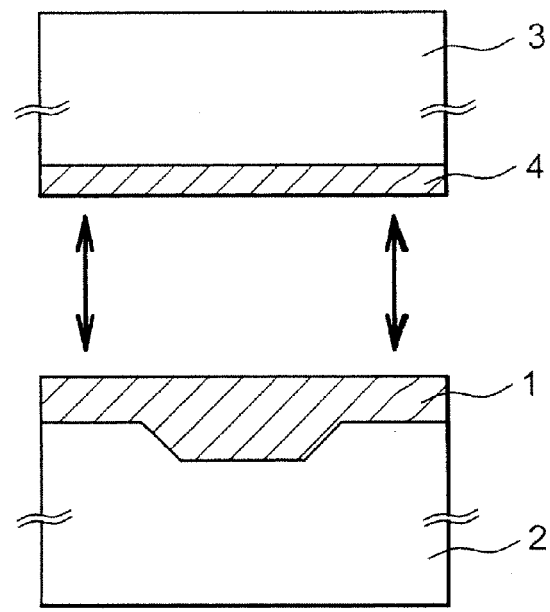
Figure 1C:
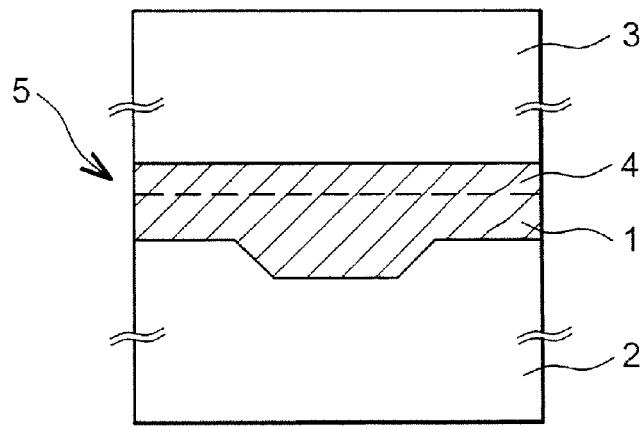

Preferably, the surfaces to be brought into contact are treated (for example chemically) to improve molecular bonding of the two structures to be assembled. Advantageously, the next step is to flatten all or part of the surfaces to be brought into contact by a polishing technique, for example of the mechanical or mechanical-chemical type, to obtain surfaces with the necessary planeness to achieve molecular bonding. Finally, molecular bonding of the read circuit and the substrate can be achieved using a proven technique for the burial material considered (see FIG. 1B). For example, hydrophilic/hydrophobic bonding can be done followed by annealing treatments. The final result is a stack 5 of two substrates, at least one of which comprises a surface topography (see FIG. 1C).

The core of the invention consists of using a molecular bonding technique. In the proposed method, any surface topography present on one or both of the two wafers to be bonded, is buried under a layer of the first or second material. The surfaces of the substrates to be bonded may be prepared in order to reinforce their chemical affinity, to reduce their surface microporosity and to eliminate residual surface contamination, and finally to enable this molecular bonding. If there is no chemical affinity between the burial layer of the first material and the second substrate, a layer of second material suitable for bonding with this burial layer of the first material may be deposited on this second substrate, even if the second substrate does not have any relief on its surface to hinder molecular bonding.

In this example, that is applicable to the assembly of a read circuit 2 and a protodetector material 3, the thickness of the burial layers, in other words the first material 1 and the second material 4, is determined such that the final thickness between the two substrates enables lateral insulation of the pixels in the read circuit. Thus, charges are transported from the photodetector to each pixel without any significant lateral transport of charges between adjacent pixels. The material for the first material and/or the second material used for bonding and/or burial of the relief are chosen as a function of its physical properties, for example as a function of its resistivity and its thickness. The resistivity and thickness of interface layers (in other words the layer(s) separating the two substrates, for example an intermediate layer comprising a burial layer and a bond layer located on the first substrate, and a bond layer located on the second substrate) are chosen such that the electrical resistance between the pixels is greater than the electrical resistance between the photodetector and the corresponding read circuit.

The intermediate layer(s) between the semiconductor based photodetector and the read circuit must assure vertical transfer of chargers without losses while minimising the transfer of charges between adjacent pixels that could occur due to fluctuations of addressing voltages of contact electrodes of the circuit. Not taking account of these constraints would result in an image with a certain degree of blurring.

For a continuous intermediate layer between the photodetection material and the read circuit, these lateral loss effects can be minimised by varying a set of parameters such as the thickness of this intermediate layer and its resistivity.

Initially, it may be sufficient to use a simple approach in which the vertical resistance is compared with the lateral resistance between pixels. Therefore, this only involves shape factors taking account of geometric data fixed by the thickness of the intermediate layer, the distance between pixels and the size of electrodes forming the pixels. The two parameters (resistivity and thickness of the layer) can then be modified to adjust the values of the vertical and lateral resistances.

Another more precise approach is based on the comparison between the quantity of charges <<deposited>> in each pixel and the quantity of charges that could pass from one pixel to another under the effect of the potential difference between the electrode considered and the adjacent electrodes. Remember that the quantity of photocreated charges depends on the dose of photons received by the detector and therefore on a number of electron-hole pairs created.

Other evaluations of the resistivity and correspondingly the thickness of the intermediate layer may be made taking account of the method used to record the signal (for example integration as a function of the count, in the case of photodetectors on a CMOS circuit).

Typically, in the case of photodetection of X rays, for ranges of the order of $10^9$ to $10^{10}$ for the resistivity of the photoconducting material, and of the order of 30 to 50 micrometers for inter-pixel dimensions, and if thicknesses of the intermediate layer are limited to a few micrometers, the resistivity is estimated at between $10^7$ and $10^9$.

For a photoconducting material with a resistance of $10^{10}$ $\Omega$.cm and an inter pixel dimension of 50 micrometers, the thickness of amorphous silicon typically compatible with the surface preparation and bonding steps being 10 micrometers, the preferred resistivity to maximise vertical conduction compared with lateral conduction is $10^8$ $\Omega$.cm. This resistivity may be obtained in a manner known to those skilled in the art by varying doping of the material and/or the production conditions (temperature, pressure, plasma temperature . . . ).

Figure 2A:
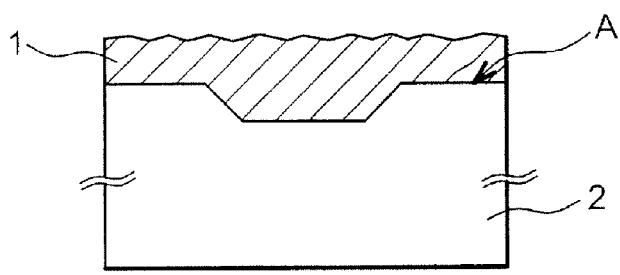
FIGS. 2A to 2C illustrate steps of another example embodiment of the method according to the invention.

According to another example, a burial layer of the first material 1 (for example amorphous silicon) is deposited on the read circuit to achieve molecular bonding with sufficient thickness to bury the topography of surface A of the circuit and to later <<flatten>> the surface of the circuit thus <<encapsulated>> (FIG. 2A). A layer of second material 4 may also be deposited (that may be identical to the first material) on the substrate wafer 3 made of a photodetection material that is to be connected to the read circuit 2. This layer is used to bury any surface roughnesses of the substrate wafer.

Figure 2B:
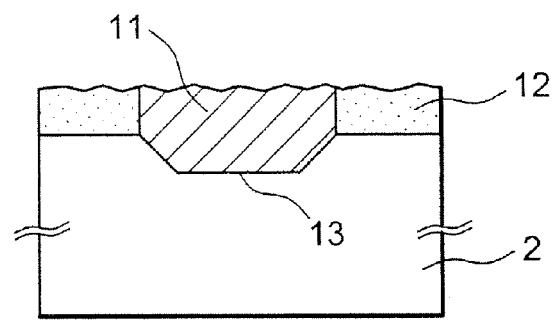
Figure 2C:
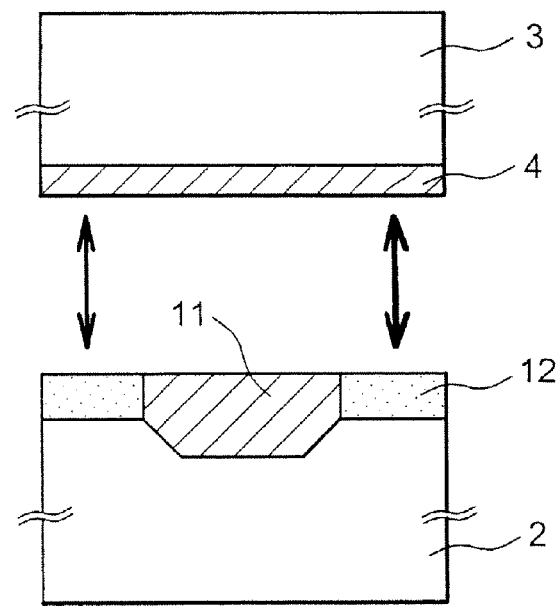

Furthermore, isolating zones 12 are defined in the burial layer of the first material for example by implantation, for example ionic implantation (for example hydrogen implantation), of parts of the burial layer. In this example, this <<texturing>> step of the burial layer is intended to insulate the pixels in the read circuit from each other laterally: there are insulating zones 12 and zones 11 comprising the first material above the pixels that are located in the cavities of the read circuit (in FIG. 2B, a pixel is located in the cavity 13). The next step is flattening of the surface of substrates and molecular bonding is done (FIG. 2C). Note that this flattening step could have been done before the step to define insulating zones in the burial layer. If a read circuit is assembled with a photodetector, this approach is particularly useful when the properties of the burial layer make it impossible to insulate pixels simply through the presence of this layer, for example when the resistivity of the material in the burial layer is too low.

Figure 3A:
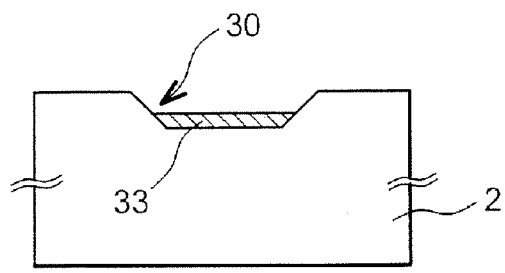
FIGS. 3A to 3D illustrate other steps of another example embodiment of the method according to the invention.

Another example provides a means of further reinforcing vertical conduction between pixels in the read circuit and the photodetector substrate wafer compared with lateral conduction between pixels. A read circuit 2 is used comprising cavities 30, the bottom of which is covered with an electrically conducting layer 33 formed from a stack of one or several metal or conducting alloy films (FIG. 3A). These metals include a metal chosen from among nickel Ni, platinum Pt, palladium Pd, cobalt Co, tungsten W, tantalum Ta, titanium Ti, vanadium V, chromium Cr, manganese Mn, iron Fe, molybdenum Mo or a mix of these elements. For conducting alloys, it is worth mentioning silicides or germanicides of these metals, and in general any electrically conducting material that can form a conducting alloy with the material in the adjacent layer.

Figure 3B:
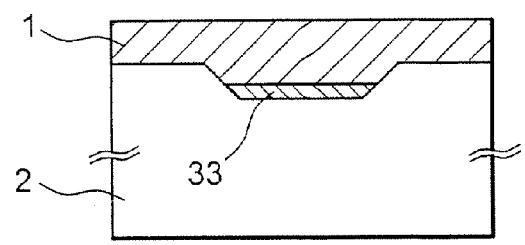
Figure 3C:
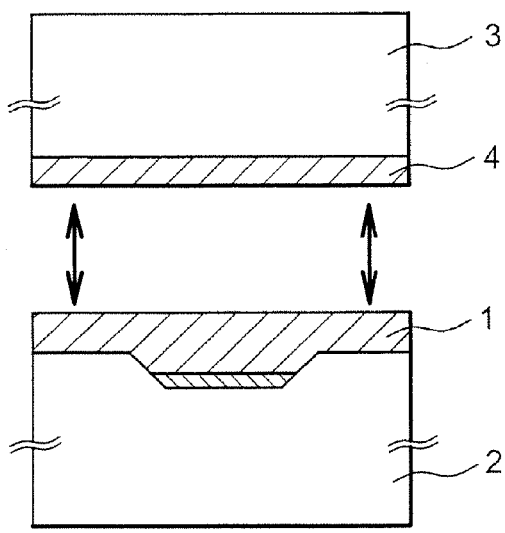
Figure 3D:
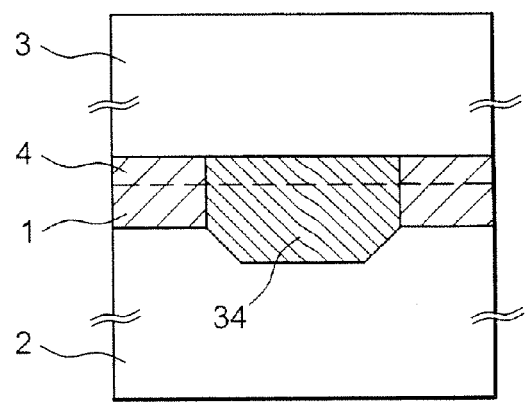
Figure 4A:
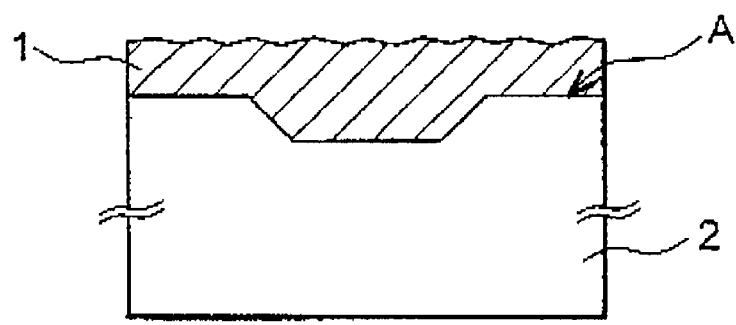
FIGS. 4A-4C show the intermediate layer including a bond layer formed on the burial layer.
Figure 4B:
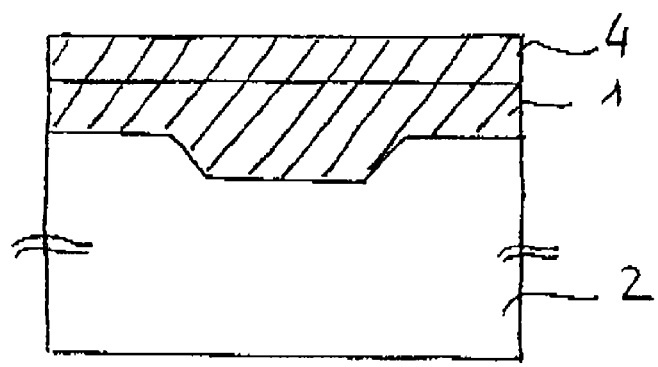
Figure 4C:
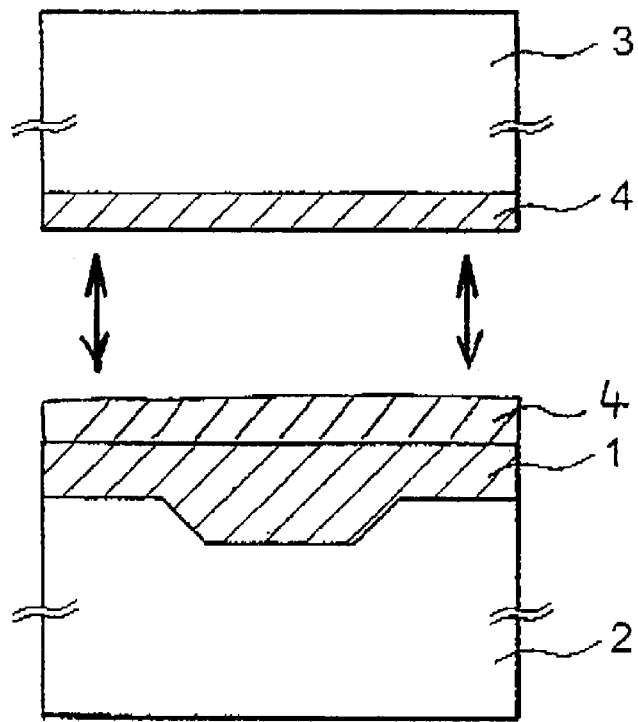
Figure 5:
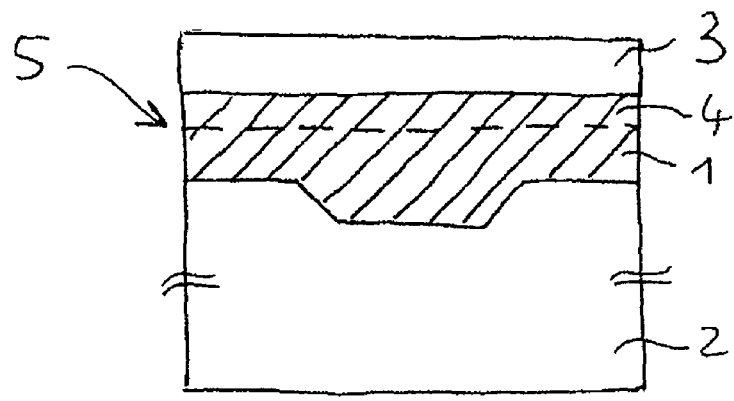
FIG. 5 shows thinning of a second substrate.
Figure 6:
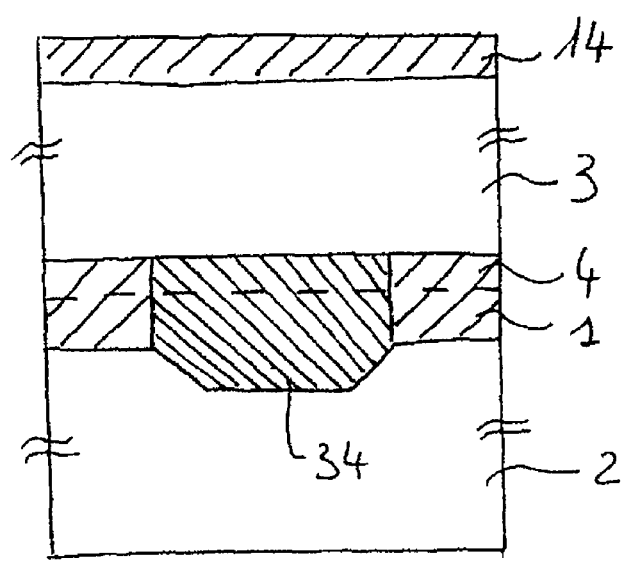
FIG. 6 shows a layer of electrically conducting material transparent to light on the assembly.
Figure 7A:
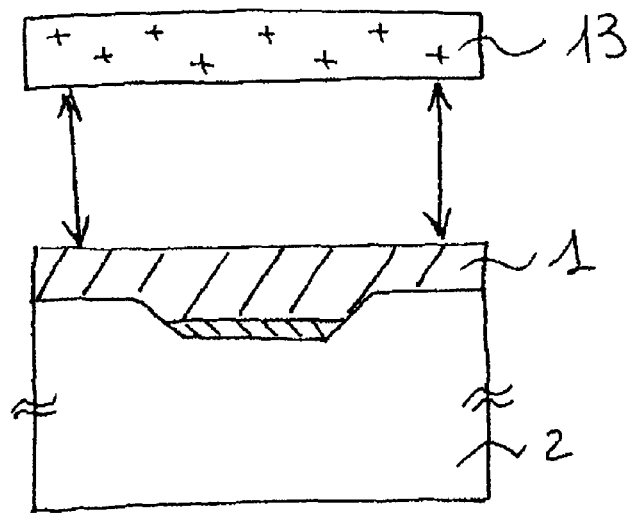
FIGS. 7A-7B show the second substrate is a doped layer and is covered with a layer of electrically conducting material transparent to light.
Figure 7B:
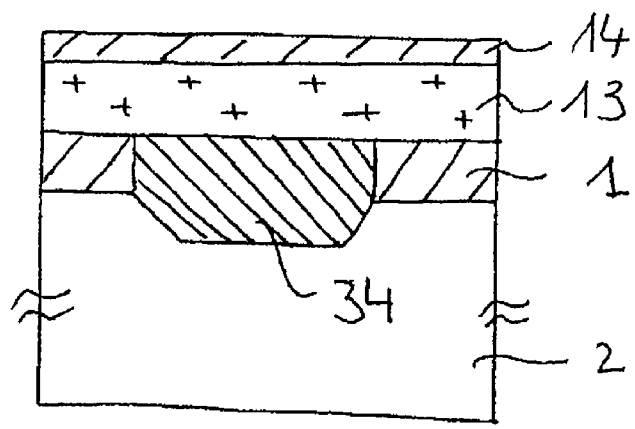
Figure 8:
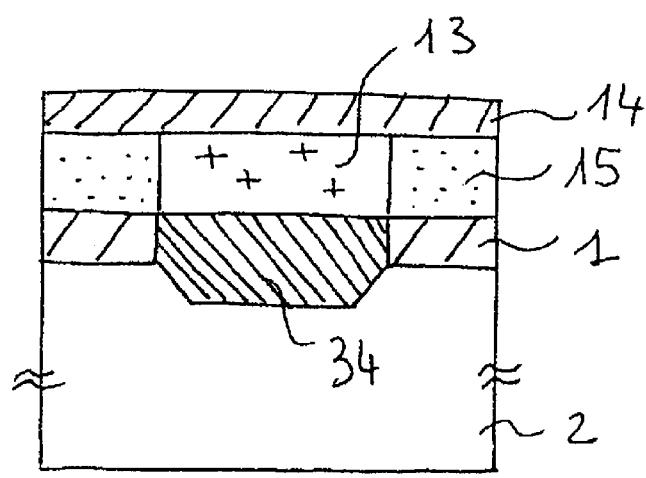
FIG. 8 shows the doped layer made locally insulating.

In the same way as in the previous examples, a sufficient burial layer 1 of material is deposited on the read circuit 2, on the surface topography of the circuit and possibly with a bond layer (not shown) and the surface to be assembled is flattened (FIG. 3B). The next step is to apply molecular bonding with a substrate of photodetection material 3, possibly comprising a bond layer of a second material, onto one of its faces in order to improve bonding (FIG. 3C). The surface of the bond layer placed on the photodetecting material may be flattened before bonding. Bonding may be done using a technique adapted to the bonding material considered (first and/or second material), for example by treating the surfaces of the substrates and making them hydrophilic or hydrophobic. Finally, formation of a conducting compound 34 is induced vertically in line with the cavities 30 of the read circuit 2, by making the electrically conducting layer react over all or part of its thickness with all or part of the thickness of the burial layer (FIG. 3D). This reaction may be induced by an adapted heat treatment, for example at temperatures that must remain compatible with the materials used. Thus, formation of a silicide type conducting compound is induced if the burial layer is based on silicon, or a germanicide type conducting compound is formed if the burial layer is based on germanium. The result is a conducting alloy joining the two substrates and participating in the vertical conduction between these two substrates.

Advantageously, the entire thickness of the burial layer facing the cavities 30 will be consumed during the alloy formation step and the electrically conducting layer will also react with zones facing the cavities 30 in the surface layer of the photodetecting material substrate (for example all or part of the thickness of the bond layer of the second material when it exists or directly the material located on the surface of the photodetecting substrate). With this variant, a zone of one or several alloys (depending on the nature of the materials used) can be created, extending on each side of the bonding interface thus reinforcing the vertical conduction.

In one alternative variant or combination, an electrically conducting layer may also be present on the substrate of photoconducting material, covered by a bond layer that can form a conducting alloy with this electrically conducting layer. This alloy can be obtained locally at the metal pads present at the bottom of the cavities, for example by laser annealing.

The materials from which the bond layer(s) or the burial layer(s) and the electrically conducting layer(s) are made must be chosen to guarantee stability of the materials in the substrates 1 and 2 under production conditions of the conducting alloy(s) formed (particularly at the production temperature).

Finally, a final example presents an imager comprising an arrayed photosensitive detector made by transferring a silicon film onto a read circuit presenting a surface topology and having conducting electrodes on the surface.

On this read circuit with surface topology, a layer of undoped silicon (intrinsic) is deposited on the face containing the electrodes; this layer is used as a burial layer for the relief on the face of the read circuit and is used to obtain good bonding of the read circuit and the detection circuit to be assembled.

The deposited silicon layer is then flattened so as to obtain a silicon layer thinner than the mono-crystalline silicon film that will be transferred onto it and that will be used as a detection layer. The deposited silicon may be of different types, amorphous, micro-crystalline or poly-crystalline, but it must have a minimum number of defects to minimise the thermal generation of electrical charges. Preferably, it may also be optimised, for example to have a gap distance similar to the gap distance of mono-crystalline silicon, so as to minimise the interface resistance between the two types of silicon.

Furthermore, so as to enable burial of the relief of the read circuit and good bond of the read circuit with the detection layer, the deposited and flattened silicon layer also has the advantage of participating in the capture of light and conversion of light into electrical charges in the continuity of the detection layer consisting of the mono-crystalline transferred silicon layer.

The next step is to transfer a layer of mono-crystalline silicon onto the silicon burial layer that will be used as a detection layer. This can be done for example using an SOI substrate formed from a substrate covered with a layer of insulating material, itself covered by a thin layer of mono-crystalline silicon. This SOI substrate is assembled by molecular bonding with the read circuit through the burial layer. The next step is removal of the substrate and the insulating layer from the SOI substrate for example by a mechanical-chemical polishing and/or chemical etching and/or by fracture at a fragile buried zone previously created in the thin silicon layer, for example by implantation of gas species (see document [2]) or by any other appropriate technique. This results in the required structure, namely the read circuit covered with a deposited silicon layer and a layer of mono-crystalline silicon (detection layer).

This layer of mono-crystalline silicon is possibly thinned so as to optimise the spectral response. Typically, this layer is 1 to 2 µm thick.

The next step is a superficial p type doping of the layer of mono-crystalline silicon, for example by ionic implantation, so as to form a diode in the silicon. As a variant, the doping process may take place before the assembly step. For example, the thin layer of mono-crystalline silicon of the SOI substrate can be doped superficially and this layer can be transferred through an intermediate substrate as described in document [3].

The next step is to deposit an electrically conducting layer transparent to the light to be detected onto the layer of mono-crystalline silicon. For example, a layer of indium oxide doped with tin (ITO) can be deposited. This transparent and conducting layer makes a collective electrical contact over the entire surface of the arrayed detector. Therefore, the zone sensitive to light that makes the electrical conversion of photons into electrical charges is located between the lower metallic electrodes of the read circuit (pixels) and the transparent upper electrode. It is composed of the deposited silicon layer, the transferred mono-crystalline silicon layer and the upper doped layer thus forming a diode in the total thickness of these layers.

Advantageously, to achieve better electrical insulation between the pixels, it would be possible to create insulating zones in the detection layer to delimit these pixels. For example, this can be done by deep etching in the mono-crystalline silicon layer or local oxidation of this layer, for example by implantation or any other adapted technique.

BIBLIOGRAPHY

[1] Tong and Gôsele, "Semiconductor wafer bonding—Science and Technology", Ed. John Wiley and sons, p 215-219, 1999.
[2] U.S. Pat. No. 5,374,564.
[3] Patent FR 2 816 445.

The invention claimed is:

1. An assembly method to enable local electrical connections between zones located on a face of a first substrate and corresponding zones located on a face of a second substrate, the faces being located facing each other, at least the first substrate having a surface topography, the method comprising:
   forming an intermediate continuous layer comprising at least one burial layer on the face of the first substrate having the surface topography to make the first substrate compatible with molecular bonding with the face of the second substrate;
   establishing contact between the face of the first substrate with the face of the second substrate so that the zones located on the face of the first substrate and the corresponding zones located on the face of the second substrate face each other; and
   bonding the face of the first substrate and the face of the second substrate by molecular bonding, resistivity and thickness of the intermediate continuous layer being sufficient to enable formation of local electrical connections between the zones on the face of the first substrate and the zones on the face of the second substrate after the bonding.

2. An assembly method according to claim 1, wherein the intermediate continuous layer further comprises a bond layer formed on the burial layer.

3. An assembly method according to claim 1, wherein, if the second substrate does not have a surface topography, said second substrate comprises a bond layer between the faces of the first and second substrates, the bond layer not disturbing the local electrical connections made possible by the intermediate continuous layer.

4. An assembly method according to claim 1, further comprising, before forming the intermediate continuous layer, forming an electrically conducting layer on at least one of the zones located on the face of the first substrate or on at least one of the corresponding zones located on the face of the second substrate, the electrically conducting layer being capable of reacting with all or part of the burial layer to form a conducting alloy zone close to the interface.

5. An assembly method according to claim 4, wherein the intermediate continuous layer further comprises a bond layer formed on the burial layer, and the electrically conducting layer also reacts with the bond layer of the intermediate continuous layer to form a conducting alloy participating in the alloy zone.

6. An assembly method according to claim 4, wherein the electrically conducting layer reacts with all or at least part of a surface zone of the substrate facing the substrate on which the electrically conducting layer was formed to form a conducting alloy participating in the alloy zone.

7. An assembly method according to claim 5, wherein the alloy is formed by applying a heat treatment.

8. An assembly method according to claim 7, wherein the heat treatment takes place after the molecular bonding.

9. An assembly method according to claim 4, wherein the electrically conducting layer includes at least one of a metal and conducting alloy.

10. An assembly method according to claim 1, further comprising polishing the burial layer after the burial layer is formed.

11. An assembly method according to claim 1, wherein the first substrate is a read circuit.

12. An assembly method according to claim 1, wherein the second substrate is made from a photodetecting material or a photoemitting material.

13. An assembly method according to claim 1, wherein the burial layer is made from a material chosen from among silicon, germanium, SiC, or SiGe.

14. An assembly method according to claim 2, wherein the bond layer is made of silicon.

15. An assembly method according to claim 2, further comprising flattening at least one burial layer or bond layer present on the face of the first or second substrate, the flattening being made before the establishing of contact between the face of the first substrate and the face of the second substrate.

16. An assembly method according to claim 1, further comprising delimiting conducting zones in one or more layers separating the first substrate and the second substrate, the conducting zones being located between the zones located on the first substrate and the zones located on the second substrate after the substrates are bonded, and reinforcing the local electrical connections allowed by the intermediate layer.

17. An assembly method according to claim 16, wherein the delimiting the conducting zones in the one or more layers separating the first substrate and the second substrate is performed before connecting the faces of the first and second substrates by implantation of one or more layers separating the first and second substrates.

18. An assembly method according to claim 16, wherein the delimiting conducting zones in the one or more layers separating the first substrate and the second substrate is performed after the molecular bonding of the faces of the first and second substrates by heat treatment such that the one or more layers separating the first substrate and the second substrate and the zones located on the faces of the first and second substrates form a conducting alloy.

19. A method for making a photosensitive detector, wherein the method includes the method according to claim 1, and further comprises:
   including a detection layer made of a material sensitive to light on the second substrate.

20. A method for making a photosensitive detector according to claim 19, wherein the detection layer is made from mono-crystalline silicon.

21. A method for making a photosensitive detector according to claim 19, wherein the detection layer is doped.

22. A method for making a photosensitive detector according to claim 21, wherein the first substrate is a read circuit.

23. A method for making a photosensitive detector according to claim 19, wherein the second substrate is an SOI.

24. A method for making a photosensitive detector according to claim 19, further comprising thinning the second substrate.

25. A method for making a photosensitive detector according to claim 19, wherein the burial layer is made from poly-crystalline, micro-crystalline, or amorphous silicon.

26. A method for making a photosensitive detector according to claim 19, further comprising at least one of flatting and thinning the burial layer before being assembled with the second substrate.

27. A method for making a photosensitive detector according to claim 19, further comprising adding a layer of electrically conducting material transparent to the light.

28. An assembly method according to claim 1, further comprising flattening at least one burial layer present on the face of the first substrate, the flattening being performed before the establishing contact between the first substrate and the second substrate.

29. An assembly method according to claim 1, wherein the intermediate continuous layer consists of a same material over its entire surface.

30. A microelectronic structure comprising:
a stack of:
a first substrate including, on its bonding face, a surface topography and at least one electrically conducting zone;
a continuous burial layer deposited on the bonding face of the first substrate with a sufficient thickness to cover the topography of the face of first substrate; and
a second substrate comprising at least one electrically conducting zone on its bonding face vertically in line with the at least one electrically conducting zone on the first substrate, the second substrate being assembled to the first substrate by molecular bonding through the continuous burial layer,
wherein resistivity and thickness of the continuous burial layer is sufficient to enable formation of local electrical connections between the at least one electrically conducting zone on the bonding face of the first substrate and the at least one electrically conducting zone on the bonding face of the second substrate.

31. The microelectronic structure of claim 30, wherein the continuous burial layer is a poly-crystalline, micro-crystalline, or amorphous silicon burial layer.

32. The microelectronic structure of claim 30, wherein the second substrate is a mono-crystalline silicon detection layer having been doped so as to form a diode in a vertical direction of the detection layer and the continuous burial layer.

33. The microelectronic structure of claim 30, further comprising:
a contact layer made of an electrically conducting material transparent to light to be detected.

34. The microelectronic structure of claim 30, wherein the second substrate is a detection layer that is locally insulating.

35. A microelectronic device according to claim 30, wherein the continuous burial layer consists of a same material over its entire surface.

* * * * *